United States Patent
Lin

(10) Patent No.: US 6,987,162 B2
(45) Date of Patent: *Jan. 17, 2006

(54) METHOD AND APPARATUS OF PRODUCING HIGH-DENSITY POLYIMIDE (HPI) FILM

(76) Inventor: Tien Tsai Lin, 2F-4, No. 6, Lane 84 Sec. 3, Shinsheng N. Road, Taipei (TW)

( * ) Notice: Subject to any disclaimer, the term of this patent is extended or adjusted under 35 U.S.C. 154(b) by 122 days.

This patent is subject to a terminal disclaimer.

(21) Appl. No.: 10/247,484

(22) Filed: Sep. 20, 2002

(65) Prior Publication Data

US 2003/0092871 A1 May 15, 2003

Related U.S. Application Data

(62) Division of application No. 09/983,242, filed on Oct. 23, 2001, now Pat. No. 6,709,714.

(51) Int. Cl.
*C08G 73/10* (2006.01)
*C23C 14/00* (2006.01)

(52) U.S. Cl. ............... 528/170; 528/353; 118/50; 118/50.1; 422/243

(58) Field of Classification Search .......... 528/170, 528/353; 118/50.1, 50; 427/508–510, 487–488; 264/405, 446, 448, 449, 455, 458, 459; 422/243
See application file for complete search history.

(56) References Cited

U.S. PATENT DOCUMENTS

| 4,737,379 A | 4/1988 | Hudgens et al. ............ 427/575 |
| 4,889,613 A | * 12/1989 | McNeal et al. ............. 204/416 |
| 5,074,770 A | 12/1991 | Graefe ........................ 425/117 |
| 5,112,462 A | 5/1992 | Swisher ...................... 205/165 |
| 6,060,175 A | 5/2000 | Swisher ...................... 428/612 |
| 6,350,844 B1 | 2/2002 | Ono et al. .................. 528/170 |
| 2003/0083458 A1 | * 5/2003 | Lin ............................. 528/170 |
| 2003/0092871 A1 | * 5/2003 | Lin ............................. 528/170 |
| 2003/0196680 A1 | * 10/2003 | Lee et al. .................... 134/1.1 |

FOREIGN PATENT DOCUMENTS

| EP | 0369408 | 5/1988 |
| EP | 0297795 | 1/1989 |
| EP | 00682821 A5 | * 11/1993 |
| EP | 00098741 A1 | * 3/2000 |

* cited by examiner

*Primary Examiner*—P. Hampton Hightower
(74) *Attorney, Agent, or Firm*—Bacon & Thomas

(57) ABSTRACT

The present invention relates to a method of producing high-density polyidimide (HPI) films and its production equipment. The production equipment comprises a raw material supplying means, a vacuum cavity, an energy supplier, a clad laminator, and a baked solidified polymer. The foregoing components constitutes the production equipment, using the monomer with the CONH bond or copolymer as raw materials to extract the unsaturated C=N bond by heat, electrons, light, radiation rays or ions as energy under low-pressure environment, so that the H in vacuum can extract the non-solidified HPI film from the electronic radical covalent polymers and via heat or light to rearrange the structure into a solidified HPI film. By means of the method according to the present invention, the original HPI that is not easily to produce as a film can be easily made in form of a film of HPI polymer on the clad laminator.

4 Claims, 7 Drawing Sheets

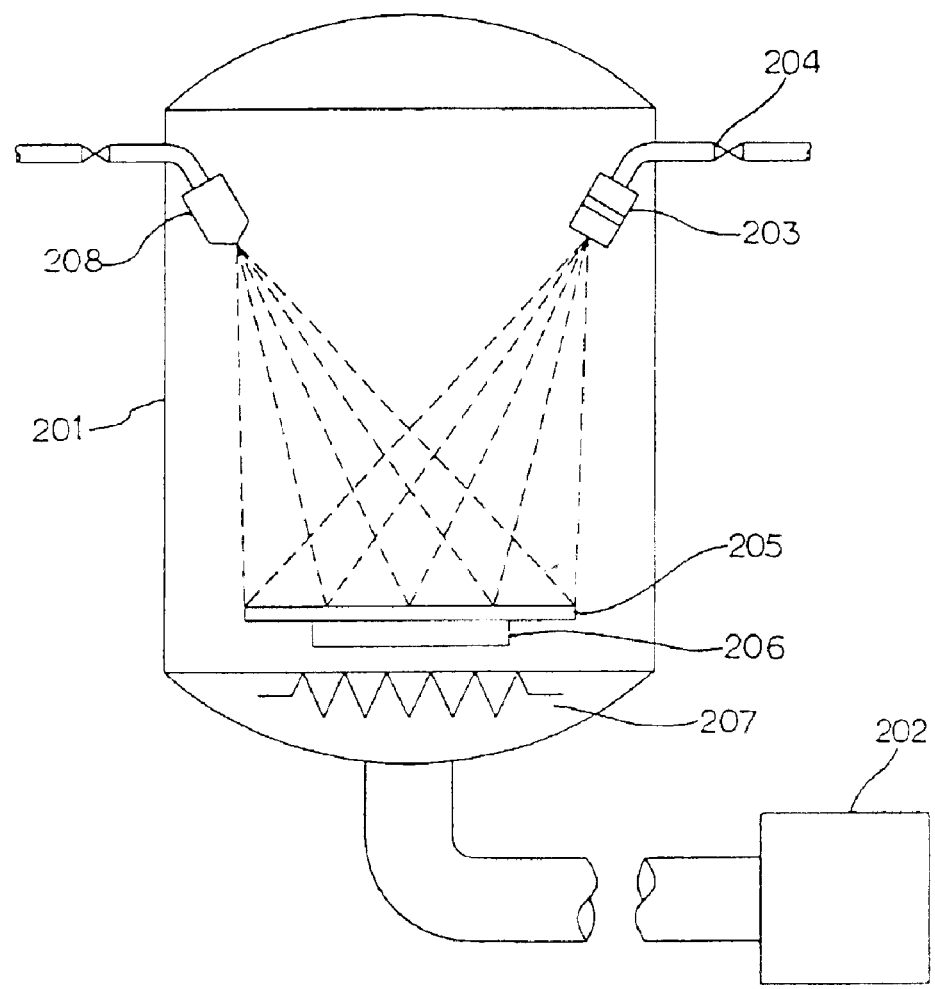
F I G. 2

METHOD AND APPARATUS OF PRODUCING HIGH-DENSITY POLYIMIDE (HPI) FILM

This application is a division of 09/983,242 filed Oct. 23, 2001, now U.S. Pat. No. 6,709,714.

BACKGROUND OF THE INVENTION

1. Field of the Invention

The present invention relates to a method of producing high-density polyidimide (HPI) films and its production equipment. The production equipment comprises a raw material supplying means, a vacuum cavity, an energy supplier, a clad laminator, and a baked solidified polymer. The foregoing components constitute the production equipment, using the monomer with the CONH bond or copolymer as raw materials to extract the unsaturated C=N bond by heat, electrons, light, radiation rays or ions as energy under low-pressure environment, so that the hydrogen (H) in vacuum can extract the non-solidified HPI film from the electronic radical covalent polymers and by using heat or light to rearrange the structure into a solidified HPI film. By means of the method according to the present invention, the original HPI that is not easily to produce as a film can be easily made in form of a film of HPI polymer on the clad laminator.

2. Description of the Related Art

The present invention relates to a method of producing a polymer HPI film and its manufacturing equipment, more particularly to a method and apparatus of producing a HPI polymer by plasma polymerization under low-pressure environment.

Generally, a traditional film is coated by means of heating or melting the solute and then coating it on a clad laminator surface. After it is cooled, and the solute is vaporized, it produces a film. The traditional HPI film is manufactured by chemical thermosetting process, unlike the traditional film coating method that simultaneously requires the processes of polymerization reaction and the coating for film formation. Therefore, it needs higher technological capacity and stricter control on the parameters; furthermore, the equipment is expensive. There are still some shortcomings such as a byproduct of water molecule ($H_2O$) is produced in the thermal imidization process, and the HPI acid is converted into a HPI. Since the production of water molecules affects the flatness of the film and causes pinholes and uneven thickness.

SUMMARY OF THE INVENTION

The primary objective of the present invention is to provide a method of producing HPI polymer film compound.

The secondary objective of the present invention is to provide a method of producing HPI polymer film.

Another objective of the present invention is to provide a method of producing a HPI polymer with high-density and high-adhesiveness without any pinholes.

According to the above objectives, the method of the present invention comprises the steps of: firstly providing a vacuum cavity as the site for proceeding with the reaction; fixing a clad laminator in the vacuum cavity, and activating, decomposing, and recombining the substance having a HPI bond such as the polymer or complex or covalent polymer or monomers by controlling the parameters of the environment temperature, gas flow, voltage of the plasma, and current, etc. and using an air extracting device to create a low-pressure environment to extract the hydrogen ion such that it produces a film having the activated substance with unsaturated polymer HPI structure on the surface of the clad laminator. Such activated substance could be an ion or a radical. The activated substance repeatedly proceeds with the covalent polymerization in appropriate environment to produce a larger polymer. In such a low-pressure environment, the gas remained after the reaction will be extracted quickly, thus facilitates the formation of HPI. Therefore, the unsaturated HPI can be converted into HPI immediately. The HPI film so produced will be subsided and accumulated directly on the surface of the solid clad laminator under the low-pressure environment, and thus has a higher density, more even film thickness with no pinholes, excellent adhesiveness on the clad laminator, and better recurrence for the reaction. And then heat or light incidence is added to produce the HPI film and rearrange the structure into a high-density polymer and bake to solidify into a HPI film.

The device according to the present invention comprises a vacuum cavity for providing a low-pressure environment at least below 20 Torrs and preferably below 1 Torr; an energy supplier for supplying energy to repeatedly perform decomposition and recombination of the polymerization to produce polymers. The form of supplied energy could be heat, light, electron collision, ion collision, and radiation ray, etc.; a raw material supplying means for supplying raw materials of monomer, polymer, copolymer, or complex of polyidimide; a clad laminator tool for fixing the clad laminator in position, and the clad laminator could be made of inorganic substance such as glass, ceramic, non-iron metal, or organic polymer, etc. and could be designed as roll-to-roll tool or sheet-by-sheet tool.

Said device may further comprise an ultraviolet light incident means or a heating means or both for providing the energy for promoting the baking and solidification of the polyidimide.

To make it easier for our examiner to understand the objective of the invention, its structure, innovative features, and its performance, we use a preferred embodiment together with the attached drawings for the detailed description of the invention.

BRIEF DESCRIPTION OF THE DRAWINGS

Other objects, features, and advantages of the invention sill become apparent from the following detailed description of the preferred but non-limiting embodiment. The description is made with reference to the accompanying drawings, in which:

FIG. 2 shows the cross-sectional diagram of the manufacturing equipment for producing high-density polyidimide film according to the present invention.

NUMERAL DENOTATION FOR THE PARTS SHOWN IN THE FIGURES

Figure 1:
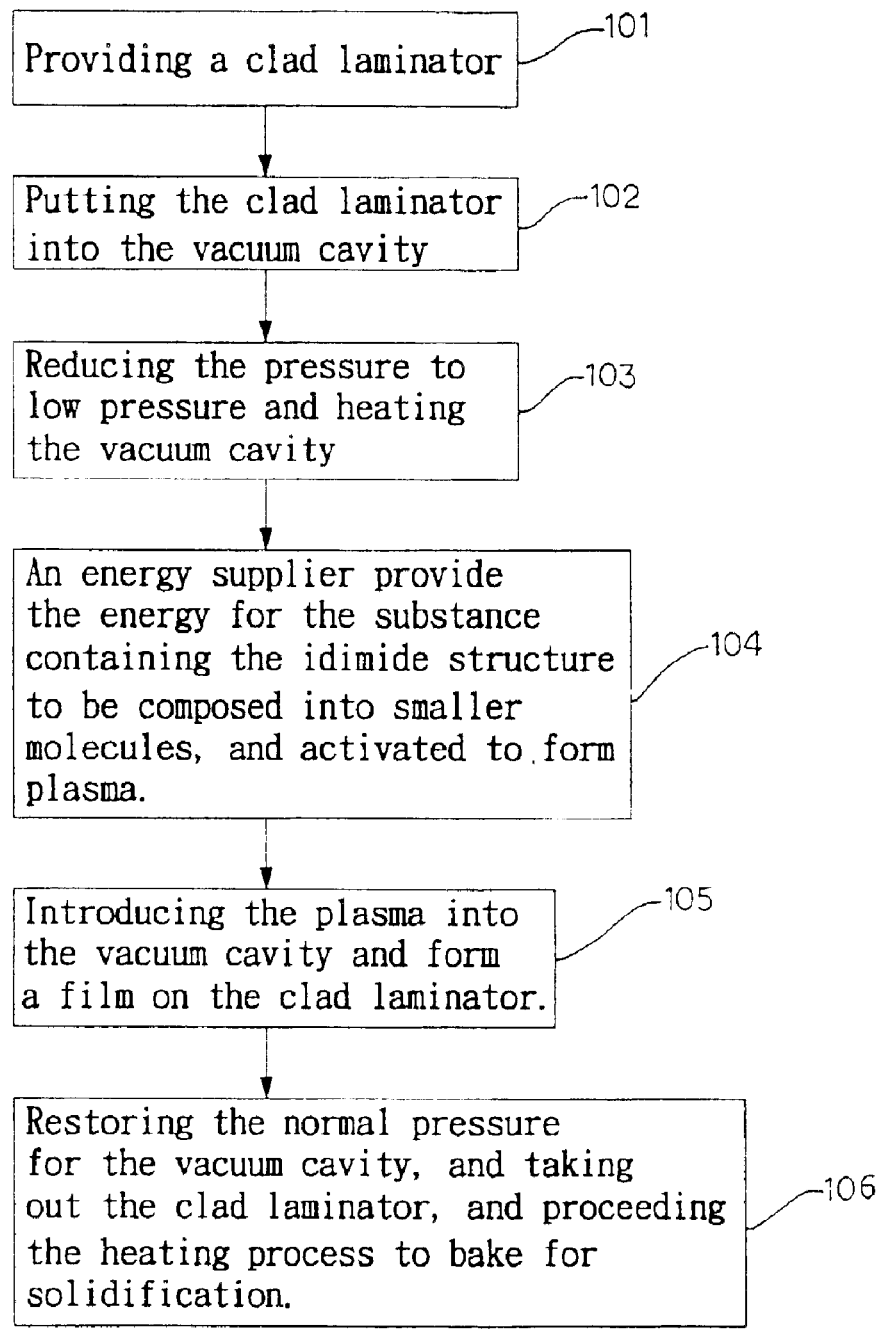
FIG. 1 shows the flowchart of the method of producing high-density polyidimide film according to the present invention.

201 Vacuum cavity
202 Extracting device
203 Energy supplier
204 Gas adjusting valve
205 Clad laminator
206 Tool
207 Heating device
208 Ultraviolet incident device
301 Copper cathode
302 Hollow pipe in the electrode
303 Target material
304 Magnetic terminal
305 Adjusting device
306 Electrode fixing block
307 Anode copper sing
308 Filament electrode

DETAILED DESCRIPTION OF THE PREFERRED EMBODIMENTS

Please refer to FIG. 1 for the method of producing a polyidimide film according to a preferred embodiment of the present invention, comprising the steps of: firstly provide a clad laminator 101; putting the clad laminator into a vacuum cavity 102, and reducing the pressure of the vacuum cavity and heat the vacuum cavity to a temperature of 103° C., wherein the so-called low temperature is about $2\times10^{-5}$ torr, and the temperature is about 160° C.; and then the substance with the structure containing the idimine is decomposed into smaller molecules by the energy supplied by the energy supplier, and activated to produce the plasma 104; then the plasma is introduced into the hollow plasma coating a film 105 on the clad laminator; finally restoring the pressure in the hollow cavity to normal pressure, and taking out the clad laminator for further heating procedure to bake and solidify the film 106.

An embodiment of the apparatus for producing a polyidimide film according to the present invention having the elements as shown in FIG. 2, comprising a hollow cavity 201 for providing a low-pressure environment and a site for the reaction; an air extracting means 202 being coupled to the pipe leading to the hollow cavity 201 for providing a low pressure environment of less than 20 torr or even below $10^{-5}$ torr, an energy supplier 203, being coupled to the vacuum cavity 201 via the pipe for supplying the energy to repeatedly decompose and recombine the substance having the idimine structure for a chain reaction to form the polymer; a gas adjusting valve 204 being connected to the energy supplier 203 to control the inflow gas such as the gas flow of the hydrogen, nitrogen, and oxygen gases; a clad laminator 205 being disposed inside the vacuum cavity 201 as a production site for the film, and its material could be inorganic matter such as glass, ceramic, non-iron metal, or organic polymer substance, etc, and also could be an integrated circuit, or a printed circuit board, a tool 206 used to fix the clad laminator 205 in position, and such tool can further comprises a heating device 207 disposed inside the vacuum cavity 201, for heating up the vacuum cavity 201 or providing energy to promote the formation of polyidimide and bake it for solidification, and said device further comprises an ultraviolet incident device 208 disposed in the hollow cavity to provide energy for promoting the formation of polyidimide and the baking for solidification.

Figure 3:
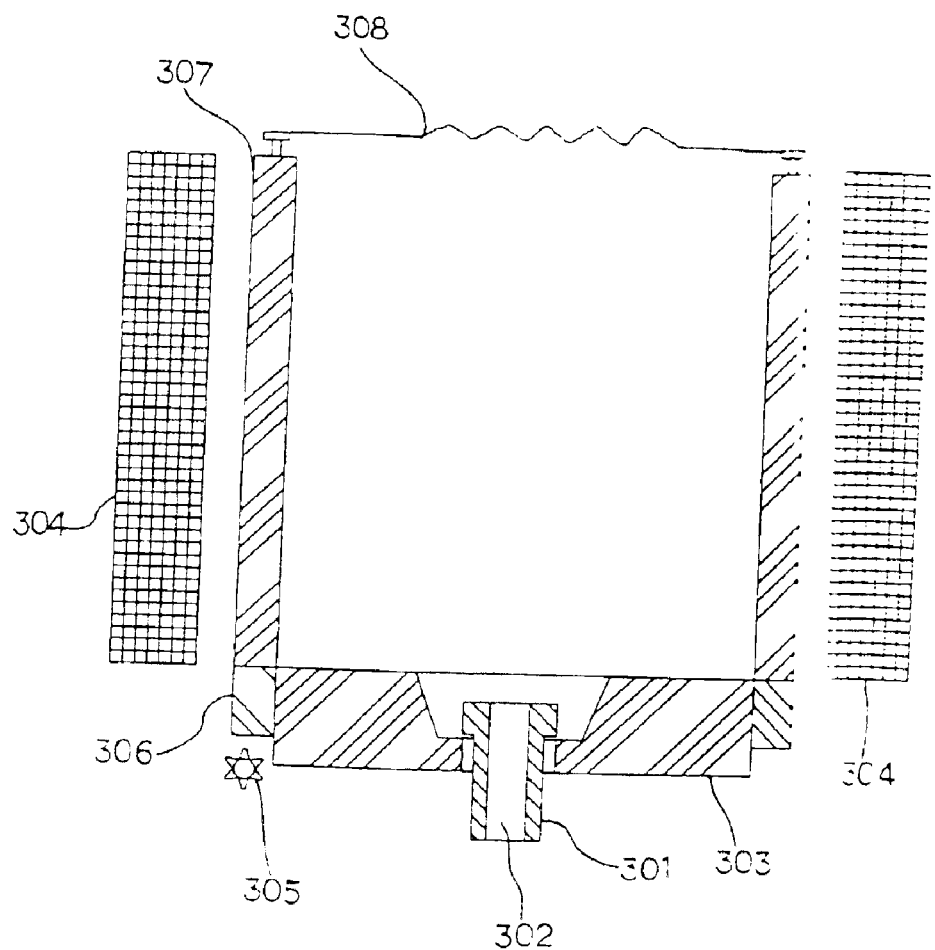
FIG. 3 shows the structure of an activated hollow ion gun.

The foregoing energy supplier 203 could be an activated hollow ion gun as shown in FIG. 3, comprising a copper cathode 301, having a hollow pipe 302 in the copper cathode 301 to facilitate the entrance of the gas, and the cathode 301 is embedded into the placing material tool, and this tool has a substance containing the idimine structure as a target material 303, and the tool is controlled by the adjusting device 305 to control the target material 303 in its rotation and feeding upward slowly; an anode copper ring 307 acts as the anode; a magnetic electrode disposed along the external rim of the anode copper ring 307 forming a cavity; an electrode fixing block for fixing the electrode; a magnetic electrode disposed along the external rim of the copper anode 307 for providing a magnetic field; a filament electrode 308 being disposed on the other end of the vacuum cavity, which could be a non-iron metal such as lead, palladium, nickel, and chromium, etc.

Figure 4A:
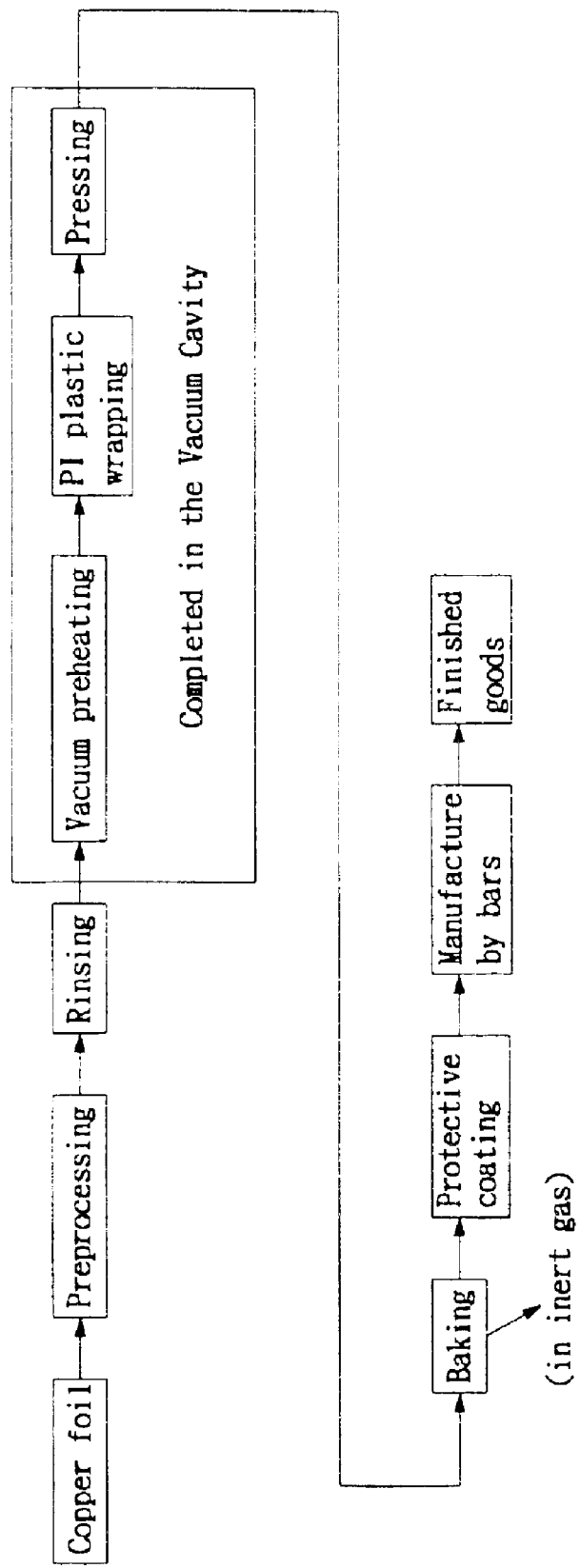
FIG. 4A shows the flowchart of producing a high-density polyidimide film on a copper clad laminator according to the method and apparatus of the present invention.
Figure 4B:
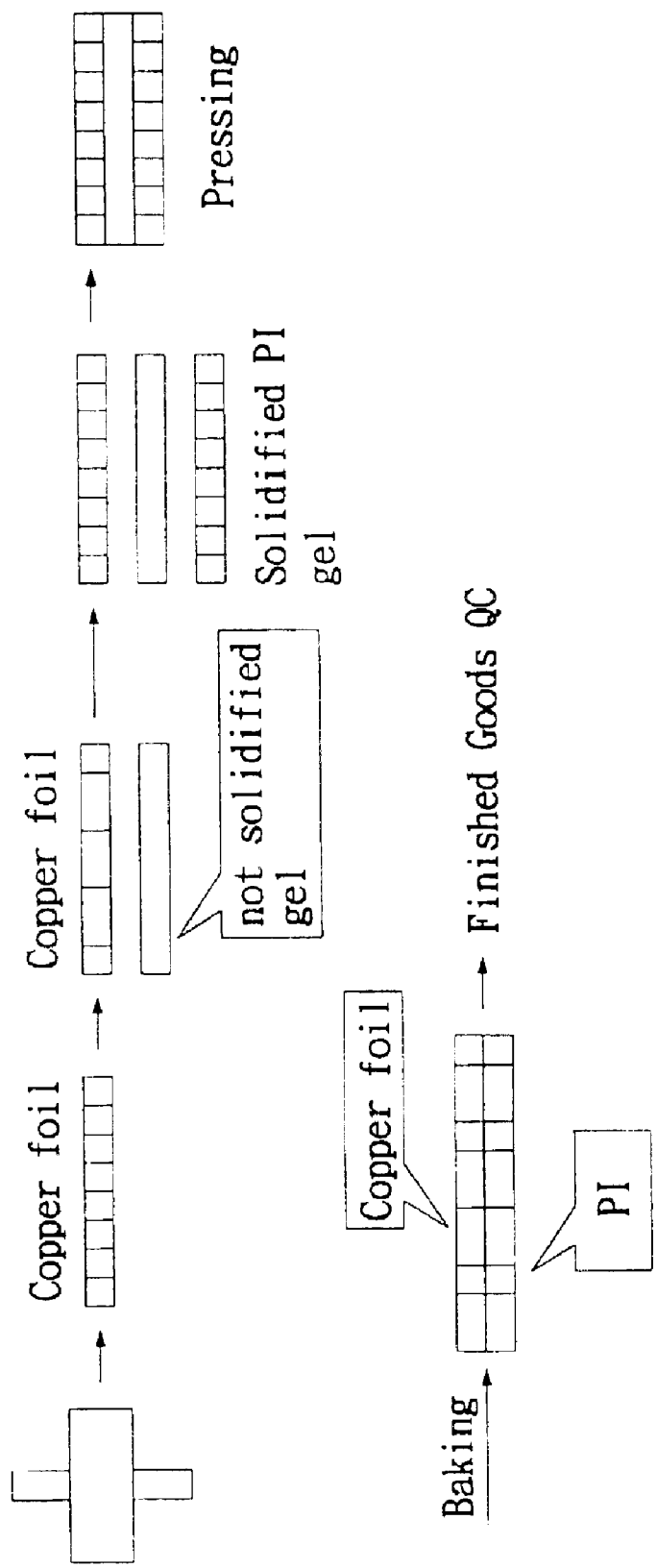
FIG. 4B shows the cross-sectional diagram of the shapes of the product during different stages of producing a high-density polyidimide film on a copper clad laminator according to the method and apparatus of the present invention.

In FIG. 4A, it shows another embodiment of the method of producing the polyidimide film according to the present invention comprising the steps of firstly providing a copper foil as the clad laminator 205; preprocessing and rinsing; putting it on the tool 206 in the vacuum cavity 201; then immediately heating the copper clad laminator 205 to about 168° C.; extracting gas to reduce the pressure to about $2\times10^{-5}$ Torr; introducing hydrogen into the activated hollow ion gun, and the pressure at the time is about $1.8\times10^{-3}$ Torr, turning on the electricity to start the ion collision on the polyidimide into small molecules to produce plasma; evaporating the polyidimide film attached on the copper clad laminator and performing polymerization to produce polyidimine in gel form, and the parameters for the above environmental conditions are as follows: the pressure from about 1 Torr to $4\times10^{-3}$ Torr can give the result of high-density polyidimide film, wherein the best pressure is about from $5\times10^{-2}$ Torr to $2\times10^{-3}$ Torr, and the second best pressure is from about $1\times10^{-1}$ Torr to about $8\times10^{-4}$ Torr. The best polymerization condition for the flow of the polyidimide molecules is about $3\times10^{-3}$ Torr, the second best is about $2\times10^{-2}$ Torr. The temperature range of the clad laminator under constant temperature is about 300° C., wherein the best range is from about 150° C. to 180° C.; the second best range is from about 100° C. to 220° C., and then perform the manufacture process of pressing, baking, adding a protective coating, manufacturing in bars to produce the finished goods. The baking is done by the ultraviolet lamp at about 300 nm to about 500 nm, and the diagram of its structure in different steps are shown in FIG. 4B.

Figure 5A:
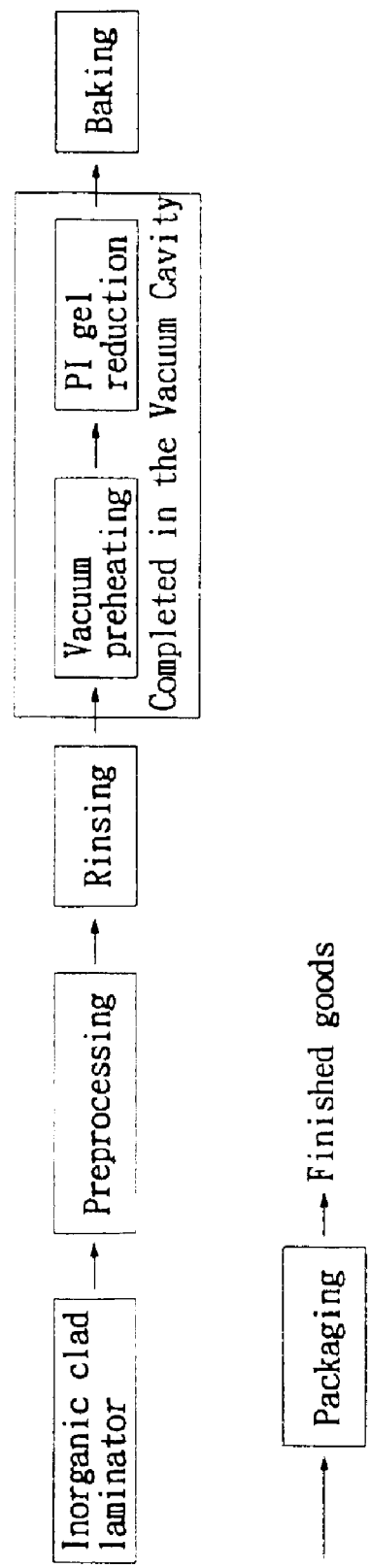
FIG. 5A shows the flowchart of producing a high-density polyidimide film on a glass clad laminator according to the method and apparatus of the present invention.
Figure 5B:
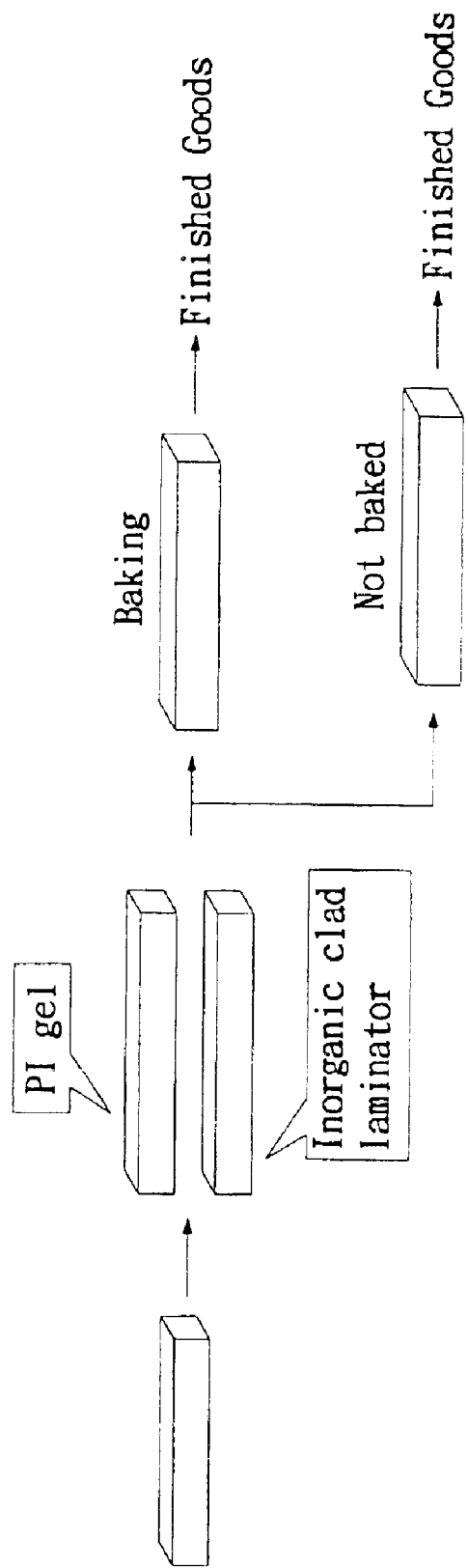
FIG. 5B shows the cross-sectional diagram of the shapes of the product during different stages of producing a high-density polyidimide film on a glass clad laminator according to the method and apparatus of the present invention.

Another embodiment of the method of producing the polyidimide film according to the present invention as shown in FIG. 5A comprises the steps of: firstly providing an inorganic clad laminator such as a piece of glass, preprocessing to and rinsing the glass; putting the glass on the tool and heating it to a temperature about 186° C. and reducing the pressure to about $2\times10^{-5}$ Torr, and using the nitrogen or hydrogen to adjust the pressure to about $4.2\times10^{-3}$ Torr; starting the power of the electronic gun. By means of heating, it repeatedly decomposes and recombines to form the polyidimide (PI) film by means of low-pressure and electron collision of hydrogen ion. The best conditions are as follows: the temperature of the clad laminator is from about 150° C. to about 180° C., and the second best is from about 120° C. to 200° C. Heating by resistors to provide the minimum energy sufficient for decomposition of the molecules is the best. If the energy is too large, then it may decompose the produced polyidimide film back into $H_2O$ and $CO_2$, and pulse discharge may be the best power used for the ion gun, and the small molecule flow of the polyidimide is from $2\times10^{-2}$ Torr to $3\times10^{-5}$ Torr, the second best is from $1\times10^{-1}$ Torr to $1\times10^{-3}$ Torr. The polyidimide so produced is in the form of transparent gel. After taking out from the nitrogen gas flow at 180° C., the baking for solidification is performed to obtain the transparent polyidimide film, and finally is packaged into finished goods. The structure at each stage is shown in FIG. 5B.

The method of the present invention can be used for the uneven aluminum clad laminator forming a polyidimide film with even thickness. In addition, it can also be used to produce the polyidimide film with even thickness on the aluminum clad laminator of an IC required to shelter the a ray with a film of 50 μm thick.

The production of HPI in the form of non-solidified gel must be done by the heat or violet ray to manufacture, rearrange, form a HPI with high molecule weight and solidify around the rim, wherein the conditions of using heat or ultraviolet ray for baking to solidification depend on the selected type of PA raw materials. Frontier molecular orbital determines whether to use heat or ultraviolet, or both for baking to solidification as an ideal mechanism in order to form a solidified HPI film of high molecular weight form the non-solidified HPI film. In general, the vacuum glow discharge under 1 Torr or below has sufficient distance for an acceleration such that the electron energy can easily reach the energy level of 2–5 eV, and the formation of radical averages to about 34 eV, and the energy for forming ions is about 9–12 eV, therefore under low-pressure vacuum, it easily to recombine into films of organic matters.

The following PA conversion or PI plasma polymerization is described in the following PA that uses the follow as examples:

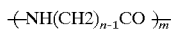

where m is the number of polymers, n is the number of its acidic salt such as PA-6, wherein n is equal to 6 then

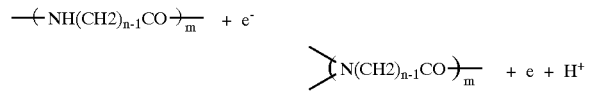

When raw material PA is the generic name for chemical compound having (—CONH—) bond. When the PA is decomposed under low-temperature plasma, the tetrahedral PA compound normally select to keep the nitrogen radical and remove the hydrogen to form unsaturated C=N bond (the atom on the double-bonded molecules must be on the same plane), and the organic matter generally does not have reduction, but is quite active in removing the hydrogen, and the idimine products are not active because it has high production rate, and the C=O radical cannot be easily radicalized because the conversion of C=O into C=O needs more energy (83.6 Kcal/mole). Therefore the polyidimide produces polymers with ionic bond, having the soluble property. Therefore, the mid-low temperature plasma in the applied plasma chemistry can have good selectivity and high reaction rate, quick releasing speed, and the released film has excellent physical properties, and the chemical property of the clad laminator has good adhesiveness and evenness. As to the general polymerization, the monomer should have special organic function mechanism such as double bonds, etc., but as to the plasma polymerization, it can have high molecular weight polymerization having the features as listed below: (1) it does not require catalyst, (2) high selectivity for material, (3) high density, (4) extremely thin with no defective, (5) high heat-resistance temperature, and (6) even thickness, etc.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing equipment for producing a high-density polyimide film, comprising:

a vacuum cavity, used to provide a low pressure reaction environment of 20 torrs or below;

a raw material supplying means to supply raw material containing idimide bond into said vacuum cavity for reaction;

an energy supplier being disposed in said vacuum cavity to provide energy for the decomposition, repeated decomposition, and recombination of said raw material; and a clad laminator and associated clad laminator tool being disposed in said vacuum cavity, wherein said clad is used for producing said polyidimide film to accumulate on, and said clad laminator tool is used to fix said clad laminator in position.

2. The manufacturing apparatus in claim 1, further comprising an ultraviolet light incident device being disposed in the said vacuum cavity or outside said vacuum cavity for providing energy for solidification of produced said polyidimide.

3. The manufacturing apparatus in claim 1, further comprising a heating device being disposed in said vacuum cavity or outside said vacuum cavity for providing energy for solidification of produced said polyidimide.

4. The manufacturing apparatus in claim 1, further comprising an ultraviolet light incident device and a heating device being disposed in said vacuum cavity or outside said vacuum cavity for providing energy for solidification of produced said polyidimide.

* * * * *